United States Patent [19]

D'Souza

[11] Patent Number: 5,581,500
[45] Date of Patent: Dec. 3, 1996

[54] MEMORY CELL WITH POWER SUPPLY INDUCED REVERSED-BIAS PASS TRANSISTORS FOR REDUCING OFF-LEAKAGE CURRENT

[75] Inventor: Godrey P. D'Souza, San Jose, Calif.

[73] Assignee: Sun Microsystems, Inc., Mountain View, Calif.

[21] Appl. No.: 498,192

[22] Filed: Jul. 5, 1995

Related U.S. Application Data

[63] Continuation-in-part of Ser. No. 358,202, Dec. 16, 1994, Pat. No. 5,471,421.

[51] Int. Cl.$^6$ .................................................. G11C 11/00
[52] U.S. Cl. ......................... 365/154; 365/148; 365/184; 365/227; 365/228
[58] Field of Search .................................. 365/154, 184, 365/148, 189.01, 227, 228

[56] References Cited

U.S. PATENT DOCUMENTS 5,020,029 5/1991 Ichinose et al. ......................... 365/154

OTHER PUBLICATIONS

FA 14.1: A Sub-0.5u A/MB Data-Retention DRAM, Hiroyuki Yamauchi et al., 1995 IEEE International Solid-State Circuits Conference, Session 14, Semiconductor Research Center, Matsushita Electric Industrial Co., Osaka, Japan, Feb. 17, 1995, pp. 244–245, 373.

FA14.2: A 29NS 64Mb DRAM with Hierarchical Array Architecture, Masayuki Nakamura et al., Hitachi Ltd., Tokyo, 1995 IEEE International Solid-State Circuits Conference, Session 14, Feb. 17, 1995, pp. 246–247, 373.

FA 14.3: Circuit Design Techniques for Low–Voltage Operating and/or Giga–Scale DRAMs, Tadato Yamagata et al., ULSI Laboratory, Mitsubishi Electric Corporation, Itami, Hyogo, Japan, 1995 IEEE International Solid–State Circuits Conference, Session 14, Feb. 17, 1995, pp. 248–249, 374.

Article entitled "Subthreshold–Current Reduction Circuits for Multi–Gigabit DRAM's ", IEEE Journal of Solid State Circuits, vol. 29, No. 7, Jul. 1994, Takeshi Sakata et al., pp. 761–771.

Article entitled "Two–Dimensional Power–Line Selection Scheme for Low Subthreshold–Current Multi–Gigabit DRAM's", IEEE Journal of Solid–State Circuits, vol. 29, No. 8, Aug. 1994, Takeshi Sakata et al., pp. 887–894.

*Primary Examiner*—David C. Nelms
*Assistant Examiner*—F. Niranjan
*Attorney, Agent, or Firm*—Philip J. McKay

[57] ABSTRACT

A memory cell is disclosed. The memory cell operating within a power supply range that induces the pass transistor(s) of the memory cell to be reversed biased when the memory cell is not being accessed. The memory cell includes a storage element capable of storing either a first data value or a second data value, a pass transistor, coupled to the storage element, and a power supply generator is coupled to the storage element. The power supply generator is configured to generate supply level voltages for the storage element so as to induce the pass transistor into a substantially reverse-biased state when the storage element is not being accessed, regardless of whether the storage element is storing the first data value or a second data value.

21 Claims, 3 Drawing Sheets

MEMORY CELL WITH POWER SUPPLY INDUCED REVERSED-BIAS PASS TRANSISTORS FOR REDUCING OFF-LEAKAGE CURRENT

The present invention is a continuation-in-part (CIP) application of co-pending application Ser. No. 08/358,202 entitled Storage Cell Using Low Powered/Low Threshold CMOS Pass Transistors Having Reduced Charge Leakage Current, filed Dec. 16, 1994, now U.S. Pat. No. 5,471,423 and incorporated by reference herein for all purposes.

BACKGROUND OF THE INVENTION

1. Field of the Invention

The present invention relates to memory cells in semiconductor memory arrays, and in particular, to a memory cell operating within a power supply range that induces the pass transistor(s) of the memory cell to be reversed biased when the memory cell is not being accessed.

2. Description of the Related Art

Dynamic random access memories (DRAMs) and static random access memories (SRAMs) typically include a number of storage cells that are organized in arrays having a plurality of rows and columns. In both DRAMs and SRAMs, a word line is associated with each row in the array. In DRAMs, one bit line (BL) is associated with each column in the array. With SRAMs, differential bit lines (BL and $\overline{BL}$) are associated with each column in the array. The reading or writing of a particular cell or row of cells in both DRAMs and SRAMs is performed using decoders, sense amplifiers, multiplexer circuits, etc., in a well known manner, and is therefore not explained in greater detail herein.

A DRAM storage cell includes a pass transistor and a storage capacitor having a storage plate and a ground plate. The gate of the pass transistor of the cell is coupled to the word line associated with the row containing the cell. The source of the pass transistor is coupled to the storage plate of the capacitor and the drain is coupled to the bit line associated with the column containing the cell. When the cell is not being accessed (standby mode), the word line associated with the cell is typically held at $V_{SS}$ (e.g. 0.0 volts). To access the cell, the word line is driven high to VDD (e.g. 3.3 or 5.0 volts), causing the pass transistor to turn on. The pass transistor turns on when the gate potential $V_{gs}$ (i.e., the word line) exceeds the potential at the source of the transistor by a threshold voltage $V_T$ (e.g., 0.7 volts). During a write operation, the data present on the bit line BL is passed through the pass transistor, and is stored on the charge plate of the capacitor. Alternatively, during a read operation, the charge stored on the charge plate is "dumped" onto the bit line BL, and is then sensed to determine its value.

An SRAM storage cell typically includes two pass transistors and two inverters. The gates of the pass transistors are coupled to the word line associated with the row containing the cell. The source of the first pass transistor is coupled to the output of the first inverter and the input of the second inverter. The source of the second pass transistor is coupled to the output of the second inverter and the input of the first inverter. The drain of the first pass transistor is coupled to bit line BL associated with the column containing the cell. The drain of the second pass transistor is coupled to the differential bit line $\overline{BL}$, associated with the column containing the cell. The SRAM stores a charge on the output of one inverter and the complement of that charge on the output of the other inverter. During a read operation, the logic levels stored on the outputs of the inverters are coupled through the pass transistors onto the respective bit lines and sensed. During a write operation, the data placed on the bit line BL is passed through the second pass transistor, is inverted by the second inverter and the inverted signal is stored on the output of the first inverter. The complementary data signal placed on bit line $\overline{BL}$ is passed through the second pass transistor, is inverted by the first inverter, and is stored on the output of the first inverter.

In prior art DRAM and SRAM storage cells, it is known to apply a negative substrate bias potential $V_{sb}$ to the pass transistor. The negative substrate bias potential $V_{sb}$ maintains the pass transistor in a "hard" off state during standby operation of the memory cell, thereby reducing the loss of charge on the storage element due to leakage through the pass transistor. The back bias potential $V_{sb}$ has the effect of shifting the $V_T$ of the pass transistor, which in turn, reduces the off-leakage current through the device. See for example, Tsukikawa et al., "An Effective Back-Bias Generator with Hybrid Pumping Circuit for 1.5 V DRAMS", IEEE, 1994. The drawback of applying a negative substrate potential $V_{sb}$ is that it detrimentally affects the switching speed (frequency) of the pass transistor. As a result the average time required to access the cells in the array is increased.

A substantial majority of DRAMs and SRAMs are fabricated using complementary metal oxide field effect transistors (CMOS). As MOSFET technology has evolved, individual MOSFETs have become steadily smaller, e.g. with smaller feature sizes, particularly shorter channel lengths. Smaller transistors has allowed more MOSFETs to be integrated together in one integrated circuit (IC), and has permitted the requisite power supply voltage VDD to become smaller. Benefits of the former include increased operating frequencies, while benefits of the latter include reduced power consumption. However, operating MOSFETs at lower power supply voltages has the undesirable effect of lowering MOSFET current which reduces the maximum operating frequency of the MOSFET. Hence, in order to maintain performance, the MOSFET threshold voltages $V_T$ are reduced so as to minimize a reduction in the MOSFET current. Further discussion of the relationships between power supply voltage, threshold voltage and operating performance for MOSFETs can be found in commonly assigned, copending U.S. patent application Ser. No. 08/292,513, filed Aug. 18, 1994, and entitled "Low Power, High Performance Junction Transistor", the disclosure of which is hereby incorporated by reference. However, lowering the $V_T$ for MOSFETs has the undesired effect of increasing off current, i.e., current leaking through the channel of the MOSFET when the device is turned off.

Accordingly, building DRAM and SRAM devices using low powered and/or threshold MOS devices is problematic because the pass transistors in these devices have a tendency to leak current when the pass transistor are off. Off-leakage current through the pass transistors can cause failure because (1) it may corrupt the data contained in the cell and (2) the charge from a number of cells coupled to a bit line may accumulate on the bit line, which prevents the sense amplifier from sensing the data on the bit line during a read operation.

Yamauchi et al. in the article entitled "A Sub-0.5M A/MB Data-Retention DRAM", IEEE International Solid State Circuits Conference, 1995, and Yamagata et at. in the article entitled "Circuit Design Techniques for Low Voltage Operating and/or Giga-Scale DRAMs", IEEE International Solid State Circuits Conference, 1995 all teach a technique of applying a negative voltage, with respect to Vss, to the gate of a pass transistor of a DRAM memory cell when the memory cell is not being accessed. The negative voltage on the pass transistor biases the transistor off hard, thereby reducing the amount of leakage current through the source and drain of the transistor.

SUMMARY OF THE INVENTION

The present invention relates to a memory cell operating within a power supply range that induces the pass transistor(s) of the memory cell to be reversed biased when the memory cell is not being accessed, thereby minimizing the off-leakage current through the source and drain of the device. The memory cell includes a storage element capable of storing either a first data value or a second data value, a pass transistor, coupled to the storage element, and a power supply generator coupled to the storage element. The power supply generator is configured to generate supply level voltages for the storage element so as to induce the pass transistor into a substantially reverse-biased state when the storage element is not being accessed, regardless of whether the storage element is storing the first data value or a second data value. The reverse-biased pass transistor substantially reduces the off-leakage current, which helps preserve the integrity of the data stored in the cell and the accumulation of change on the bit line coupled to the cell. The present invention is particularly useful for memory devices using low threshold MOS transistors. The invention substantially reduces the problem of off-leakage current without the need to generate a third power supply outside the normal voltage supply of range VDD and VSS.

In accordance with two embodiments of the invention, the storage cell may be either a DRAM or an SRAM. With an DRAM, the power supply generator generates a first power supply of approximately VDD and a second power supply of VSS when the memory cell is being accessed. When the memory cell is not being accessed, the power supply generator generates a first power supply of VDD and a third power supply of VSS+Δ. The third power supply of VSS+Δ helps maintain the pass transistor of the DRAM in a substantially reverse-biased state, regardless of whether the storage element is storing the first data value or the second data value thereby minimizing the amount of off-leakage current through the pass transistor. With an SRAM, the power supply generator generates a first power supply of VDD and a second power supply of VSS when the memory cell is being read. When the memory cell is being written to or is in the standby state, the power supply generator generates a first power supply of approximately VDD and a third power supply of VSS+Δ. The third power supply of VSS+Δ A maintains the pass transistors of the SRAM in a substantially reverse-biased state, thereby minimizing the amount of off-leakage current through the pass transistors.

BRIEF DESCRIPTION OF THE DRAWINGS

The objects, features and advantages of the present invention will be apparent from the following description in which.

DESCRIPTION OF THE PREFERRED EMBODIMENT

Figure 1:
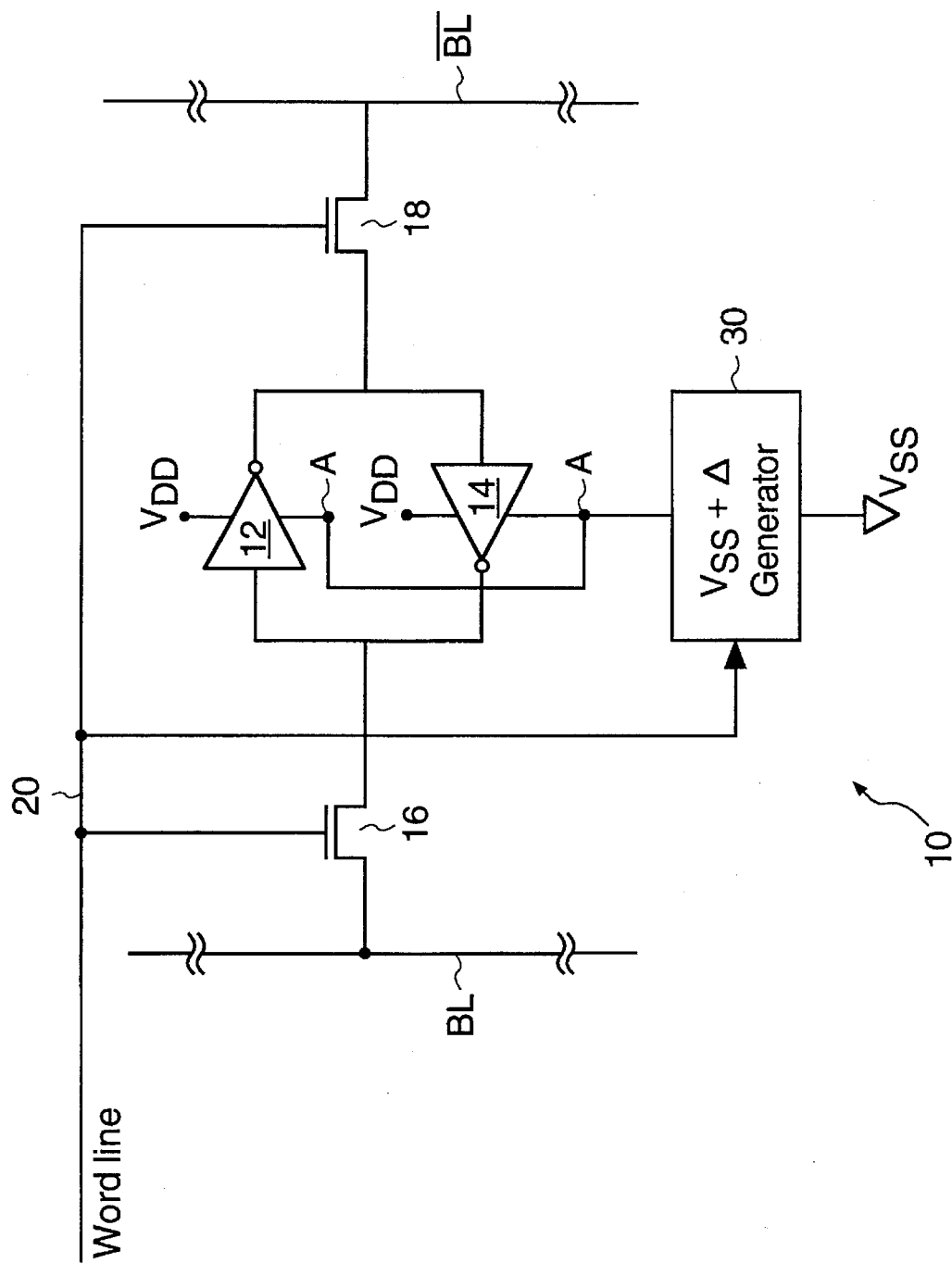
FIG. 1 illustrates an SRAM memory cell according to the present invention.

Referring to FIG. 1, an SRAM memory cell according to the present invention is shown. The SRAM memory cell 10 includes a first inverter 12, a second inverter 14, a first pass transistor 16 and a second pass transistor 18. The outputs of the first inverter 12 and the second inverter 14 are cross-coupled (i.e., the output of the first inverter 12 is coupled to the input of the second inverter 14, and the output of the second inverter 14 is coupled to the input of the first inverter 12). The first pass transistor 16 has its gate coupled to word line 20, its source coupled to the output of inverter 14 and the input of inverter 12, and its drain coupled to bit line BL. The second pass transistor 18 has its gate coupled to word line 20, its source coupled to the output of inverter 12 and the input of inverter 14, and its drain coupled to bit line $\overline{BL}$. A VSS+Δ generator circuit 30 is coupled to the inverter 12 and inverter 14 at node A.

The inverter 12 and the inverter 14 are coupled to a positive power supply of VDD (hereafter referred to as the "first" power supply). The VSS +Δ generator circuit 30 provides inverter 12 and inverter 14 with a negative power supply of either VSS (hereafter referred to as the "second" power supply), or VSS+Δ (hereafter referred to as the "third" power supply). The VSS+Δ generator circuit 30 is coupled to and is controlled by the word line 20. When the word line 20 is activated and the memory cell 10 is being read, the VSS+Δ generator circuit 30 provides the second power supply of VSS to the inverter 12 and the inverter 14. On the otherhand, when the memory cell 10 is in the standby state, or the memory cell 10 is being accessed for a write operation, the VSS+Δ generator circuit 30 provides the third power supply of VSS+Δ to the first inverter 12 and the second inverter 14.

Figure 2:
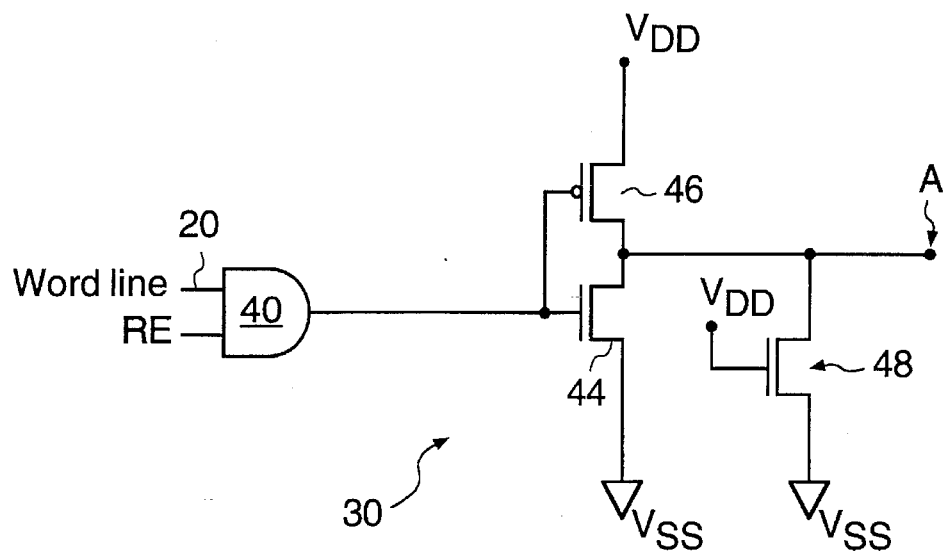
FIG. 2 illustrates a VSS+Δ generator circuit according to the present invention.

Referring to FIG. 2, a circuit diagram of the VSS+Δ generator circuit 30 is shown. The VSS+Δ generator circuit 30 includes an AND gate 40, an N-channel transistor 44, a P-channel transistor 46, and N-channel transistor 48. The AND gate 40 is coupled to receive the word line 20 and a Read Enable signal. The gate of transistor 44 and 46 are coupled to the output of AND gate 40. The source and drains of transistors 44 and 46 are coupled in series between VDD and VSS. The output node A of the circuit 30 is provided between the channels of transistors 44 and 46. The gate of transistor 48 is coupled to VDD. The source and drain of transistor 48 is coupled between node A and VSS.

The potential at node A is either VSS+Δ or VSS, depending on the output of AND gate 40. When both the wordline 20 and the Read Enable signal are high, indicating that memory cell 10 is about to be read., the output of AND gate 40 transitions high. Consequently, transistor 44 turns on, and transistor 46 turns off and node A is pulled down to the second supply voltage level of VSS. On the otherhand, when the memory cell 10 is in the standby state, or the memory cell 10 is being written to, the output of the AND gate is low because either the word line 20, the Read Enable signal, or both, are low. As a result, transistor 44 is off, and transistor 46 is on, creating a pull up effect on node A. Transistor 48, which is always on, pulls down node A. as a result, node A is at the third supply level of VSS+Δ. As is well known in the art, the relative sizes of transistor 44 and transistor 46 can be varied to selectively control the voltage delta Δ at node A. In one embodiment, transistors 44 and 48 are ten microns and transistor 46 is four microns. As a result, VDD=1.0 volts, and $\Delta$=2.0 volts.

Referring again to FIG. 1, operation of the memory cell 10 is best described using several examples. Examples of the memory cell 10 in the (1) standby state; (2) read state; and (3) write state are provided below.

1. Standby State

In the standby state, the memory cell 10 stores either a logical one or a logical zero. The bit lines BL and $\overline{BL}$ are typically biased to VDD. If the memory cell 10 stores a logical one for example, then the output of inverter 14 is pulled up to the first power supply VDD. Pass transistor 16 is therefore reversed biased off because both its source and drain are at VDD, and its gate coupled to the word line 20 which is at VSS. On the complement side of the memory cell 10, the output of inverter 12 is low at the third power supply level VSS+$\Delta$. Since the source of pass transistor 18 is coupled to the output of inverter 12, the source of the transistor is also at VSS+$\Delta$. The potential at both the source and drain of the pass transistor 18 is therefore higher than its gate VSS. As a result, the pass transistor 18 is reversed-biased off. Since both pass transistor 16 and pass transistor 18 are both reversed-biased off in the standby state, there is relatively little off current leakage from the storage element onto the bit lines BL and $\overline{BL}$. The integrity of the data in the memory cell 10 is therefore preserved, and the accumulation of charge on the bit lines BL and $\overline{BL}$ is reduced. If the memory cell 10 stores a logical zero, it operates in the complement of that described above.

2. Read State

During a read operation, the memory cell 10 is accessed, and the contents of the memory cell is determined. If a logical zero is stored in memory cell 10 for example, the output of inverter 12 is at the level of the first power supply VDD, and the output of inverter 14 is at the level of the third power supply VSS+$\Delta$. In preparation for the read operation, the bit lines BL and $\overline{BL}$ are precharged. The word line 20 is also driven high to VDD, causing the pass transistor 16 and pass transistor 18 to turn on. The Read Enable signal is also driven high, causing the output of the VSS +$\Delta$ generator circuit 30 to transition from the third power supply level VSS+$\Delta$ to the second power supply level VSS. As a result, the negative power supply applied to the inverter 14 transitions from VSS+$\Delta$ to VSS. Since the output of inverter 12 is high, the charge on bit line $\overline{BL}$ remains high. On the otherhand, since the output of inverter 14 is low, the charge on bit line BL is dissipated through pass transistor 16 to the second supply voltage VSS of inverter 14. Since the negative supply of inverter 14 is VSS, and not VSS+$\Delta$, during a read operation, the charge on the bit line BL can be dissipated faster. In otherwords, more current can be sunk through the inverter 14 when its negative power supply is VSS, as opposed to VSS+$\Delta$. If the memory cell 10 stores a logical one, it operates in the complement of that described above.

3. Write State

During a write operation, data is stored in the memory cell 10. The write operation is initiated by driving the word line 20 high, which turns on pass transistor 16 and pass transistor 18. Subsequently, complementary data signals are placed on bit line BL and bit line $\overline{BL}$. For example, if a logical one is to be written into the memory cell 10, the bit line BL is driven to a logical high level and the bit line $\overline{BL}$ is driven to a logical low level. The first inverter 12 receives the logical high signal from bit line BL through pass transistor 16, and in response thereto, generates at the output of the inverter 12 a low signal at the third supply voltage VSS+$\Delta$. The second inverter 14 receives the logical low signal from bit line $\overline{BL}$ through pass transistor 18, and in response thereto, generates at the output of the inverter 14 a high signal at the first supply voltage VDD. Since the Read Enable signal is not activated. The output of the VSS+$\Delta$ generator circuit 30 remains at the third voltage level of VSS+$\Delta$ because the Read Enable signal is not activated. Since a write operation requires the outputs of the first inverter 12 and the second inverter 14 to swing between the first power supply and the third power supply, the write operation is performed faster between VDD and VSS+$\Delta$, as opposed to VDD and VSS, because of the smaller voltage swing. If a logical zero is written into the memory cell 10, it operates in the complement of that described above.

Figure 3:
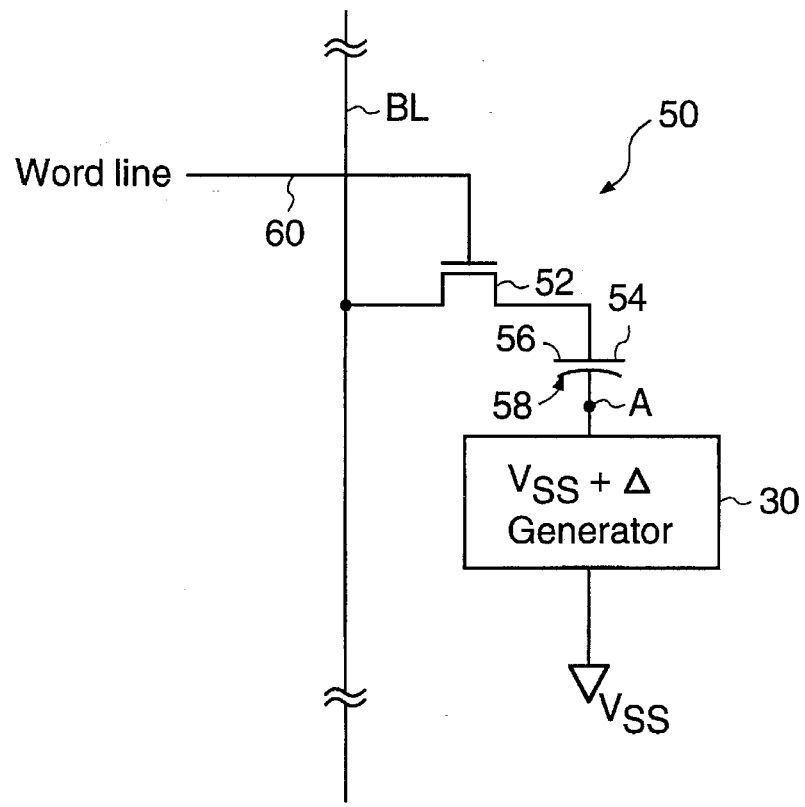
FIG. 3 illustrates a DRAM memory cell according to the present invention.

Referring to FIG. 3, a DRAM memory cell according to the present invention is shown. The DRAM memory cell 50 includes a pass transistor 52, a capacitor 54 having a charge plate 56 and a "ground" plate 58, and a VSS+$\Delta$ generator circuit 30. The gate of the pass transistor 52 is coupled to word line 60, the source is coupled to the charge plate 56 of capacitor 54, and the drain is coupled to the bit line BL. It should be noted that a modified version of the VSS+$\Delta$ generator circuit 30 may be used with the DRAM memory cell 50 as described above. In the modified version of the VSS+$\Delta$ generator circuit, the AND gate 40 is removed and the word line 60 is coupled directly to the gate of transistor 44 and transistor 46. When the word line 60 is inactive, the transistor 44 is off and the transistor 46 is on, and the VSS+$\Delta$ generator circuit 30 applies the third supply voltage of VSS+$\Delta$ to the ground plate 58 of the capacitor 54. When the memory cell is going to be read or written, the word line 60 is activated, causing transistor 44 to turn on, and the output of the VSS +$\Delta$ generator circuit 30 to transition to the second power supply VSS.

During the standby state, the word line 20 is pulled down low to VSS. The bit line BL is biased typically to either VDD or VDD/2, depending on the design of the memory. If the memory cell 50 stores a logical one, then a charge of approximately VDD is present on the charge plate 56. Since the charge in the charge plate 56 and on the bit line BL are greater than the voltage on the gate of the pass transistor 52, the pass transistor 52 is reversed-biased off. As a result, the off-leakage current through pass transistor 52 is minimal. On the otherhand, if the memory cell 50 stores a logical zero, the charge on charge plate 56 is at approximately the same as the third power supply VSS+$\Delta$. The pass transistor 52, however, is still reversed-biased off, because the potential of the source and drain of the transistor are greater than the potential at the gate. The off-leakage current through the pass transistor 52 is therefore substantially reduced, regardless of whether the cell stores a logical one or a logical zero. In contrast, if the second power supply VSS was applied to the capacitor 54, the voltage at the gate and source of pass transistor 52 would approximately be the same when the cell was storing a logical zero, resulting in substantial leakage current through the pass transistor 52.

When the memory cell 50 is being accessed, the VSS+$\Delta$ generator circuit 30 provides the second supply voltage of VSS to the ground plate 58 of the capacitor 54. The read and write operation of the memory cell 50 is the same as described above in the background section of the present application.

Figure 4:
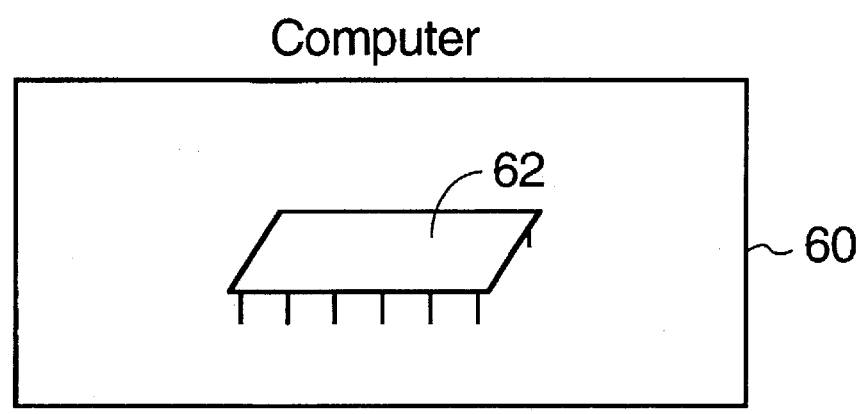
FIG. 4 illustrates a memory chip containing a memory cell of the present invention in a computer system.

Referring to FIG. 4, a block diagram of a computer is shown. The computer 60 includes one or more semiconductor chips 62. The chips 62 contain one or more of the SRAM memory cells 10, the DRAM memory cells 50, or any other type of memory cell using the off-current leakage prevention technique of the present invention. In accordance with various embodiments, the memory cells of the present invention may be used on a DRAM chip, an SRAM chip, or contained in a cache memory array on a microprocessor chip.

Although the foregoing invention has been described in detail with respect to several specific embodiments, it will be apparent that certain changes and modifications may be made without departing from the spirit of the invention. For example, the technique of the present invention can be extended to any type of memory cell or sized memory array, including ROMS, EPROMS, EEPROMS and flash memory. The leakage reduction technique of the present invention is also particularly useful in large memory arrays, where the fan out, i.e., number of memory cells coupled to a bit line or differential bit lines is relatively large. Other variations of the invention are also possible. For example, if the bit lines are pre-discharged VSS, instead of pre-charged, a lower supply voltage (VDD–Δ) may be needed to reverse-bias the PFET pass transistor of the memory cell. Further, if an NFET pass transistor is used in a pre-discharge scheme, the bit lines may be discharged to a VSS+Δ value. It is intended that the specification be only exemplary, and that the true scope of the invention be indicated by the following claims.

What is claimed is:

1. A memory cell, comprising:
   a storage element capable of storing either a first data value or a second data value;
   a pass transistor, coupled to the storage element; and
   a power supply generator, coupled to the storage element, the power supply generator configured to provide a first power supply and a second power supply to the storage element when the storage element is being read, and the first power supply and a third power supply to the storage element so as to induce the pass transistor into a substantially reverse-biased state when the storage element is not being read, regardless of whether the storage element is storing the first data value or the second data value.

2. The memory cell of claim 1, wherein the storage element is a DRAM.

3. The memory cell of claim 2, wherein the first power supply is VDD and the third power supply is (VSS+Δ).

4. The memory cell of claim 1, further comprising a word line driver circuit configured to drive a word line coupled to the pass transistor, the word line driver circuit configured to the drive the word line to a voltage potential of approximately VSS so that the pass transistor is maintained in a substantially reversed biased state when the storage element is not being accessed.

5. The memory cell of claim 4, wherein the word line driver is further configured to drive the word line coupled to the pass transistor to a voltage potential of approximately VDD to turn the the pass transistor on so that that the storage element can be accessed.

6. The memory cell of claim 1, wherein the second power supply is VSS.

7. The memory cell of claim 1, wherein the power supply generator comprises a circuit that is capable of providing the supply voltage of either VSS or (VSS+Δ) depending on the state of the memory cell.

8. The memory cell of claim 1, wherein the storage element is an SRAM.

9. The memory cell of claim 1, wherein the power supply generator is configured to generate the first power supply and the third power supply when the storage element is not being accessed.

10. The memory cell of claim 1, wherein the power supply generator is configured to generate the first power supply and the third power supply when the storage element is being written.

11. The memory cell of claim 1, wherein the third supply voltage is between the first supply voltage and the second supply voltage.

12. The memory cell of claim 1, further comprising a plurality of the memory cells arranged in an array on a semiconductor chip.

13. The memory cell of claim 12, wherein the semiconductor chip is contained in a computer.

14. A method of providing a memory cell capable of operating in either a standby state or an access state, the method comprising:
   providing a storage element capable of storing either a first data value or a second data value;
   providing a pass transistor, coupled to the storage element; and
   providing a power supply generator, coupled to the storage element, the power supply generator configured to provide a first power supply and a second power supply to the storage element when the storage element is being accessed, and the first power supply and a third power supply to the storage element so as to induce the pass transistor into a substantially reverse-biased state when the storage element is not being read, regardless of whether the storage element is storing the first data value or the second data value.

15. The process of claim 13, wherein the provided storage element is a DRAM.

16. The process of claim 13, wherein the provided storage element is an SRAM.

17. The process of claim 14, wherein the power supply generator is configured to generate the first power supply and the second power supply when the memory cell is being read and the first power supply and the third power supply when the memory cell is not being accessed or is being written.

18. A method of operating a memory cell capable of operating in either a standby state or an access state, the method comprising:
   storing either a first data value or a second data value in a storage element having a pass transistor;
   generating a first supply voltage and a second supply voltage for the storage element when the storage element is being read; and
   generating the first supply voltage and a third supply voltage for the storage element which induces the pass transistor into a substantially reverse-biased state when the storage element is not being read, regardless of whether the storage element is storing the first data value or a second data value.

19. The process of claim 18, wherein the provided storage element is a DRAM.

20. The process of claim 18, wherein the provided storage element is an SRAM.

21. The memory cell of claim 7, wherein the circuit comprises:
   a logic circuit coupled to receive a word line signal and an enable signal, and configured to generate the third power supply when the enable signal and the word line signal are logically true.

* * * * *